US006213869B1

(12) United States Patent
Yu et al.

(10) Patent No.: US 6,213,869 B1

(45) Date of Patent: Apr. 10, 2001

(54) MOSFET-TYPE DEVICE WITH HIGHER DRIVER CURRENT AND LOWER STEADY STATE POWER DISSIPATION

(75) Inventors: Bin Yu, Santa Clara; John C. Holst, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/309,105

(22) Filed: May 10, 1999

(51) Int. Cl.[7] .................................... H01L 21/8249

(52) U.S. Cl. .................................... 458/236; 257/328

(58) Field of Search .................................... 257/273, 288, 257/300, 328, 378, 487, 495, 525, 526, 533, 563; 438/189, 190, 194, 204, 210, 236

(56) References Cited

U.S. PATENT DOCUMENTS 4,618,872 * 10/1986 Baliga .................................... 357/23.4
5,559,368 9/1996 Hu et al. .................................... 257/369
5,717,241 * 2/1998 Malhi et al. .................................... 257/378
5,966,032 * 10/1999 Elrabaa et al. .................................... 326/84

* cited by examiner

*Primary Examiner*—Matthew Smith
*Assistant Examiner*—Calvin Lee
(74) *Attorney, Agent, or Firm*—Monica M. Choi

(57) ABSTRACT

A coupling capacitor is coupled between the gate and the body region of a MOSFET (Metal Oxide Semiconductor Field Effect Transistor). The body region of the MOSFET is electrically isolated to form a floating body region. The capacitance of the coupling capacitor is designed such that a BJT (Bipolar Junction Transistor) connected in parallel with the MOSFET turns on when the MOSFET turns on. In addition such a design of the coupling capacitor lowers the magnitude of the threshold voltage of the MOSFET when the MOSFET is turned on. Furthermore, the capacitance of the coupling capacitor is designed such that the magnitude of the threshold voltage of the MOSFET is raised when the MOSFET is turned off. Thus, the MOSFET type device of the present invention has both higher drive current when the MOSFET is turned on and lower steady state power dissipation when the MOSFET is turned off with a variable threshold voltage.

17 Claims, 3 Drawing Sheets

MOSFET-TYPE DEVICE WITH HIGHER DRIVER CURRENT AND LOWER STEADY STATE POWER DISSIPATION

TECHNICAL FIELD

This invention relates to transistor devices fabricated as part of integrated circuits, and more particularly, to a MOSFET (Metal Oxide Semiconductor Field Effect Transistor) type device with an especially designed capacitor coupled between the gate and the body of a MOSFET such that the MOSFET has a threshold voltage of lower magnitude when the MOSFET is turned on for higher drive current and such that the MOSFET has a threshold voltage of higher magnitude when the MOSFET is turned off for lower steady state power dissipation.

BACKGROUND OF THE INVENTION

MOSFETs (Metal Oxide Semiconductor Field Effect Transistors) are a common component in integrated circuits fabricated on a semiconductor wafer. The current characteristic of a MOSFET when the MOSFET is turned on is as follows:

$$I_D=k(V_{GS}-V_t)^2$$

with $I_D$ being the drain current of the MOSFET, k being a constant that depends on the size and fabrication parameters of the MOSFET, $V_{GS}$ being the gate to source voltage of the MOSFET, and $V_t$ being the threshold voltage of the MOSFET, as known to one of ordinary skill in the art of electronics.

For better circuit performance, higher speed and thus higher drain current is desired when the MOSFET is turned on. Thus, when the MOSFET is turned on, a threshold voltage $V_t$ with lower magnitude is desired. On the other hand, for lower steady state power dissipation when the MOSFET is turned off, a threshold voltage with higher magnitude is desired.

Higher device speed and lower power dissipation require opposite constraints on the threshold voltage of a MOSFET. In prior art MOSFETs, the threshold voltage is typically the same for when the MOSFET is turned on and for when the MOSFET is turned off. Therefore, a trade-off between higher device speed and lower steady state power dissipation is considered with the prior art MOSFET device.

However, both higher device speed and lower steady state power dissipation are desired for high performance integrated circuits. Thus, a MOSFET type device is desired that may be designed both for higher device speed when the MOSFET is turned on and for lower steady state power dissipation when the MOSFET is turned off.

SUMMARY OF THE INVENTION

Accordingly, the present invention is a MOSFET (Metal Oxide Semiconductor Field Effect Transistor) type device having higher drive current when turned on and having lower steady state power dissipation when turned off. The MOSFET type device is fabricated on a semiconductor substrate. Generally, the MOSFET type device comprises a floating body 1*a* region that is electrically isolated from the semiconductor substrate, a drain region that is formed abutting the floating body region, a source region that is formed abutting the floating body region, and a gate formed on a gate insulator disposed on top of the floating body region between the drain region and the source region. The present invention also includes a coupling capacitor that is operatively coupled between the gate and the floating body region, and the coupling capacitor has a capacitance of $C_C$. The floating body region, the drain region, the source region, and the gate form a MOSFET (Metal Oxide Semiconductor Field Effect Transistor). The drain region forms a collector of a BJT (Bipolar Junction Transistor), and the floating body region forms a base of the BJT, and the source region forms an emitter of the BJT. The MOSFET is turned on to provide the drive current when a voltage change of $V_{dd}$ is applied on the gate with respect to the source of the MOSFET. In accordance with the present invention, the capacitance, $C_C$, of the coupling capacitor is designed such that $[V_{body(I)}+(C_C*V_{dd})/(C_C+C_P)]>V_C$ to provide a positive voltage at the floating body region with respect to the source region when the MOSFET is turned on, where $V_{body(I)}$ is an initial voltage at the floating body region immediately before the voltage change of $V_{dd}$ is applied on the gate with respect to the source of the MOSFET, where $C_P$ is a capacitance of an effective parasitic capacitor at the floating body region, and where $V_C$ is a clamping voltage of a diode formed by the base and the emitter of the BJT.

In this manner, the design of the capacitance $C_C$ of the coupling capacitor, such that $[V_{body(I)}+(C_C*V_{dd})/(C_C+C_P)]>V_C$, results in the BJT turning on when the MOSFET is turned on. In addition, the positive voltage at the floating body region with respect to the source region, when the MOSFET is turned on, results in a threshold voltage of lower magnitude according to the body effect of the MOSFET.

Furthermore, the capacitance, $C_C$, of the coupling capacitor may be designed such that $[V_C-(C_C*V_{dd})/(C_C+C_P)]$ is a negative value to provide a negative voltage at the floating body region with respect to the source region when the MOSFET is turned off. In this manner, the design of the capacitance $C_C$ of the coupling capacitor, such that $[V_C-(C_C*V_{dd})/(C_C+C_P)]$ is a negative value, results in the BJT turning off when the MOSFET is turned off. In addition, the negative voltage at the floating body region with respect to the source region, when the MOSFET is turned off, results in a threshold voltage of higher magnitude according to the body effect of the MOSFET. The present invention further includes a mechanism for ensuring that the voltage at the floating body region with respect to ground is at $V_{body(I)}$ before the voltage change of $V_{dd}$ is applied on the gate with respect to the source of the MOSFET to turn the MOSFET back on.

Thus, with proper design of the capacitance $C_C$ of the coupling capacitor, the MOSFET type device of the present invention has higher drive current when the MOSFET is turned on and lower steady state power dissipation when the MOSFET is turned off.

These and other features and advantages of the present invention will be better understood by considering the following detailed description of the invention which is presented with the attached drawings.

The figures referred to herein are drawn for clarity of illustration and are not necessarily drawn to scale. Moreover, the figures referred to herein focus on a few regions within a larger integrated circuit. Elements having the same reference number in FIGS. 1, 2, 3, 4, 5, 6, 7, 8, 9, and 10 refer to elements having similar structure and function.

DETAILED DESCRIPTION

Figure 1:
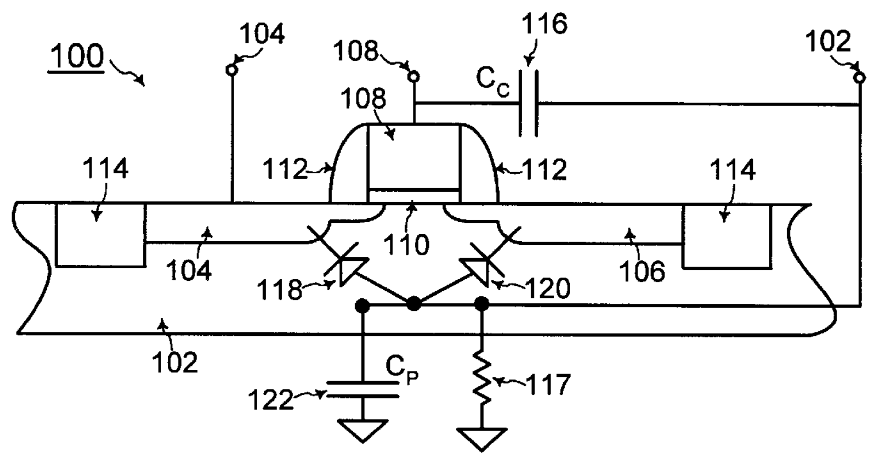
FIG. 1 shows a cross-sectional view of a MOSFET (Metal Oxide Semiconductor Field Effect Transistor) type device including a resistor coupled between a floating body region of the MOSFET and ground, according to a first embodiment of the present invention.

Referring to FIG. 1, a cross sectional view of a MOSFET (Metal Oxide Semiconductor Field Effect Transistor) type device 100 is fabricated on a semiconductor substrate. The MOSFET type device 100 includes a floating body region 102 electrically isolated from the semiconductor substrate. The MOSFET type device 100 also includes a drain region 104 abutting the floating body region 102 and a source region 106 abutting the floating body region 102. A gate 108 typically comprised of polysilicon is formed on a gate insulator 110 typically comprised of silicon dioxide. The gate insulator 110 is disposed on top of the floating body region 102 between the drain region 104 and the source region 106.

Spacers 112 typically comprised of silicon dioxide surround the polysilicon of the gate 108 and the silicon dioxide 110. In addition, an insulator material fills isolation trenches 114 for shallow trench isolation. According to the present invention, a coupling capacitor 116 is coupled between the gate 108 and the floating body region 102. The coupling capacitor 116 has a capacitance of $C_C$. In addition, in the embodiment of the present invention as illustrated in FIG. 1, a grounding resistor 117 is coupled between the floating body region 102 and ground.

The floating body region 102, the drain region 104, the source region 106, and the gate 108 form a MOSFET (Metal Oxide Semiconductor Field Effect Transistor). The present invention is now described for a MOSFET type device having an N-channel MOSFET. However, the present invention may be used for a MOSFET type device having a P-channel MOSFET, as would be apparent to one of ordinary skill in the art from the description herein.

Figure 2:
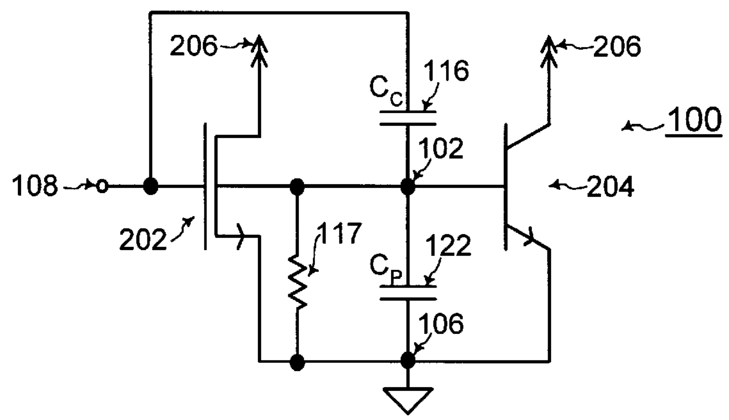
FIG. 2 shows a circuit diagram of the cross section of FIG. 1 including a MOSFET and a BJT (Bipolar Junction Transistor) connected in parallel, according to the first embodiment of the present invention.

Referring to FIGS. 1 and 2, assuming that the MOSFET formed by the floating body region 102, the drain region 104, the source region 106, and the gate 108 is an N-channel MOSFET, the body region 102 is formed of a p-type semiconductor material, and the drain region 104 and the source region 106 are formed of an n-type semiconductor material.

FIG. 2 shows a diagram of the circuit formed by the cross section of FIG. 1 including a N-channel MOSFET 202 formed by the floating body region 102, the drain region 104, the source region 106, and the gate 108. In addition to the N-channel MOSFET 202, an NPN BJT 204 is formed by the floating body region 102, the drain region 104, and the source region 106. Referring to FIGS. 1 and 2, the floating body region 102 forms a base of the NPN BJT 204, the drain region 104 forms a collector of the NPN BJT 204, and the source region 106 forms an emitter of the NPN BJT 204.

Referring to FIGS. 1 and 2, a first diode 118 is formed by the p-type semiconductor material of the floating body region 102 and the n-type semiconductor material of the drain region 104. The first diode 118 also forms the collector-base junction of the NPN BJT 204. A second diode 120 is formed by the p-type semiconductor material of the floating body region 102 and the n-type semiconductor material of the source region 106. The second diode 120 also forms the emitter-base junction of the NPN BJT 204.

An effective parasitic capacitor 122 is coupled from the floating body region 102 to ground. The effective parasitic capacitor 122 has a capacitance of $C_P$ which is determined by fabrication process parameters during fabrication of the integrated circuit having the MOSFET type device 100 of FIG. 1. The effective parasitic capacitor 122 is formed predominantly by the diode junction between the floating body region 102 and the source region 106. Referring to FIG. 2, the drain region 104 of the MOSFET 202 and thus the collector 104 of the NPN BJT 204 are coupled to a high bias voltage source 206.

According to the present invention, for higher drive current when the MOSFET type device 100 is turned on, the capacitance $C_C$ of the coupling capacitor 116 is designed such that $[V_{body(I)}+(C_C{*}V_{dd})/(C_C+C_D)]>V_C$. $V_C$ is a clamping voltage of the second diode 120 formed by the base and the emitter of the NPN BJT 204. $V_{dd}$ is a voltage change applied on the gate 108 with respect to the source region 106 to turn on the MOSFET 202. $V_{body(I)}$ is an initial voltage at the floating body region 102 immediately before the voltage change of $V_{dd}$ is applied on the gate 108 with respect to the source 106 of the MOSFET 202.

When the MOSFET 202 is turned on, the voltage $V_g$ at the gate 108 is switched from a voltage such as 0V for example to the voltage of $V_{dd}$ (assuming that the voltage at the source region 106 is 0V). A body voltage $V_{body(ON)}$ formed at the floating body region 102 when the MOSFET 202 is turned on is as follows:

$$V_{body(ON)}=V_{body(I)}+(C_C{*}V_{dd})/(C_C+C_P)$$

Thus, $V_{body(ON)}$ depends the capacitive divider between the effective parasitic capacitor 122 and the coupling capacitor 116.

Figure 3:
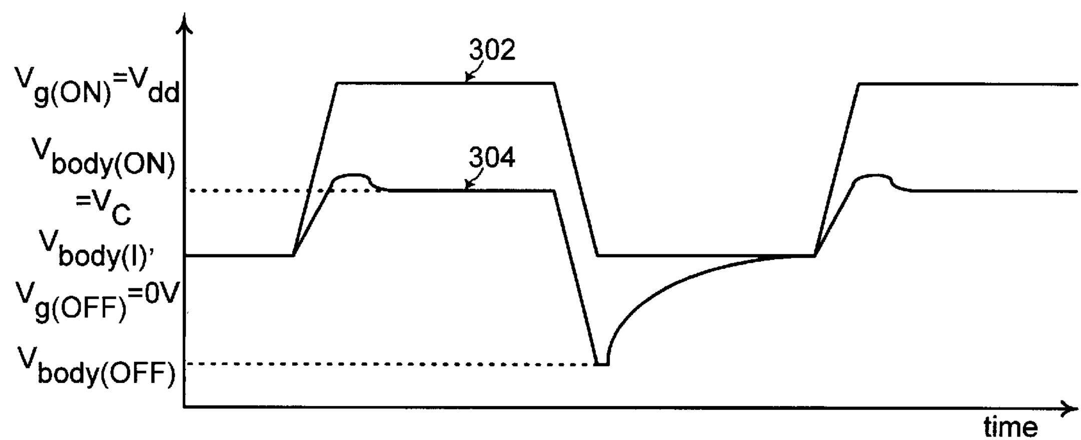
FIG. 3 shows a timing diagram of the voltage applied on the gate and the voltage formed on the body node of the MOSFET of FIGS. 1 and 2, according to the first embodiment of the present invention.

Referring to FIG. 3, a first voltage waveform 302 shows the voltage $V_g$ at the gate 108.

A second voltage waveform 304 shows the voltage $V_{body}$ formed at the floating body region 102. When the voltage of $V_{dd}$ is applied at the gate 108, the voltage $V_{body}$ formed at the floating body region 102 also rises according to the equation $V_{body(ON)}=[V_{body(I)}+(C_C*V_{dd})/(C_C+C_P)]$. According to the present invention, the capacitance $C_C$ of the coupling capacitor is designed such that initially $V_{body(ON)}=[V_{body(I)}+(C_C*V_{dd})/(C_C+C_P)]>V_C$, where $V_C$ is a clamping voltage of the second diode 120 formed by the base and the emitter of the NPN BJT 204.

Referring to FIGS. 2 and 3, when the capacitance $C_C$ of the coupling capacitor is designed such that $[V_{body(I)}+(C_C*V_{dd})/(C_C+C_P)]>V_C$, a displacement charge within the floating body region 102 increases the voltage at the floating body region 102, $V_{body(ON)}$, to be greater than $V_C$ initially when a voltage change of $V_{dd}$ is applied at the gate 108. Such displacement charge is greater than the charge necessary for biasing the floating body region 102 at the clamping voltage of $V_C$. Such extra charge flows out of the floating body region 102 through a forward-biased diode 120 and into the source region 106. This current causes the BJT 204 to turn on.

Referring to FIG. 3, this extra displacement charge flows out from the floating body region 102 when initially a voltage change of $V_{dd}$ is applied at the gate 108 and when $V_{body(ON)}>V_C$. However, when this extra displacement charge has been dissipated, then $V_{body(ON)}$ is clamped back down to $V_C$, and the BJT 204 eventually turns back off as shown by the second voltage waveform 304 in FIG. 3.

In this manner, initially when the voltage change of $V_{dd}$ is applied at the gate 108 and the MOSFET 202 is turned on, the NPN BJT 204, which is connected in parallel with the MOSFET 202, also initially turns on to provide higher drive current for charging up any load capacitance coupled to the MOSFET type device 100 of the present invention. In addition, a positive voltage at the floating body region 102 with respect to the source region 106 lowers the magnitude of the threshold voltage $V_t$ of the MOSFET 202 according to the body effect as known to one of ordinary skill in the art. Since the drive current of the MOSFET $I_D=k(V_{GS}-V_t)^2$, the drive current is raised with the lower magnitude of the threshold voltage $V_t$.

Furthermore, according to the present invention, for lower steady state power dissipation, when the MOSFET type device 100 is turned off, the capacitance, $C_C$, of the coupling capacitor 116 is designed such that $[V_C-(C_C*V_{dd})/(C_C+C_P)]$ is a negative value. $V_C$ is the clamping voltage of the second diode 120 formed by the base and the emitter of the NPN BJT 204. $V_{dd}$ is a voltage change applied on the gate 108 with respect to the source region 106 to turn on the MOSFET 202.

When the MOSFET 202 is turned off, the voltage $V_g$ at the gate 108 is switched from the voltage of $V_{dd}$ to the voltage of 0V for example (assuming that the voltage at the source region 106 is 0V). A body voltage $V_{body(OFF)}$ formed at the floating body region 102 when the MOSFET 202 is turned off is as follows:

$$V_{body(OFF)}=[V_C-(C_C*V_{dd})/(C_C+C_P)]$$

According to the present invention, the capacitance $C_C$ of the coupling capacitor is designed such that $V_{body(OFF)}=[V_C-(C_C*V_{dd})/(C_C+C_P)]$ is a negative value.

With such a voltage for $V_{body(OFF)}$ from this design of the capacitance $C_C$ of the coupling capacitor, the second diode 120 formed by the base and the emitter of the NPN BJT 204 is reversed biased and conducts substantially zero current. In turn, the NPN BJT 204 turns off, and the voltage $V_{body(OFF)}$ formed at the floating body region 102 becomes negative with respect to the source region 106. Referring to FIGS. 1, 2, and 3, a negative voltage $V_{body(OFF)}$ results in a negative voltage at the floating body region 102 with respect to the source region 106.

In this manner, when the MOSFET 202 is turned off, the NPN BJT 204 also turns off to minimize steady state power dissipation. In addition, a negative voltage at the floating body region 102 with respect to the source region 106 raises the magnitude of the threshold voltage $V_t$ of the MOSFET 202 according to the body effect as known to one of ordinary skill in the art. As a result, the leakage current of the MOSFET 202 is minimized with the higher magnitude of the threshold voltage $V_t$ when the MOSFET 202 is turned off.

Thus, the coupling capacitor 116 of the MOSFET type device 100 of the present invention is designed such that the MOSFET type device 100 has a lowered magnitude of the threshold voltage when the MOSFET type device 100 is turned on and a higher magnitude of the threshold voltage when the MOSFET type device 100 is turned off. Thus, the MOSFET type device 100 has higher drive current when the MOSFET type device 100 is turned on and has lower power dissipation when the MOSFET type device 100 is turned off.

Referring to FIGS. 2 and 3, after the voltage $V_g$ 302 at the gate 108 is switched to 0V and after $V_{body(OFF)}=[V_C-(C_C*V_{dd})/(C_C+C_P)]$, the grounding resistor 117 charges up the floating body region 102 back to 0V since the grounding resistor 117 is coupled between the floating body region 102 and ground. Then, when the voltage $V_g$ 302 at the gate 108 is again switched from 0V to $V_{dd}$ at the next cycle of $V_g$ 302, $V_{body(I)}$=0V. The capacitance $C_C$ of the coupling capacitor 116 is designed such that $V_{body(ON)}=[V_{body(I)}+(C_C*V_{dd})/(C_C+C_P)]>V_C$ to ensure that the BJT 204 also turns on when the MOSFET 202 is turned on with a voltage change of $V_{dd}$ applied on the gate 108 with respect to the source region 106 of the MOSFET 202. In the embodiment of the present invention of FIG. 1, $V_{body(I)}$=0V from the grounding resistor 117 being coupled between the floating body region 102 and ground.

The resistance value R of the grounding resistor 117 is designed such that the RC time constant $[R*(C_C+C_P)]$ is small enough to ensure that the floating body region 102 may charge back up to $V_{body(I)}$=0V before the voltage $V_g$ 302 at the gate 108 is again switched from 0V to $V_{dd}$ at the next cycle of $V_g$ 302. On the other hand, the resistance value R of the grounding resistor 117 is designed to be not too low to prevent any immediate bleed-off of the displacement charge, at the floating body region 102, that turns on the BJT 204 when the MOSFET 202 is turned on.

Figure 4:
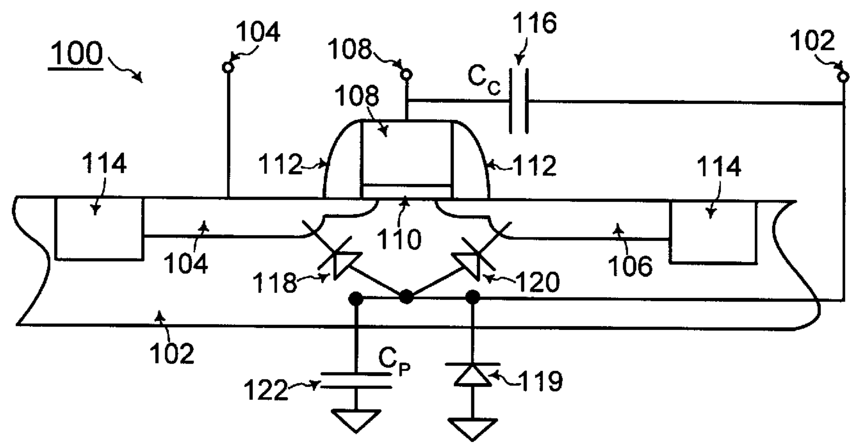
FIG. 4 shows a cross-sectional view of a MOSFET (Metal Oxide Semiconductor Field Effect Transistor) type device including a diode coupled between the floating body region of the MOSFET and ground, according to a second embodiment of the present invention.
Figure 5:
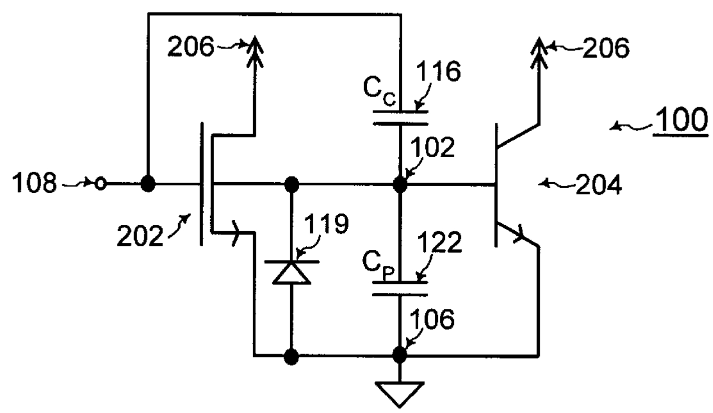
FIG. 5 shows a circuit diagram of the cross section of FIG. 4 including a MOSFET and a BJT (Bipolar Junction Transistor) connected in parallel, according to the second embodiment of the present invention.
Figure 6:
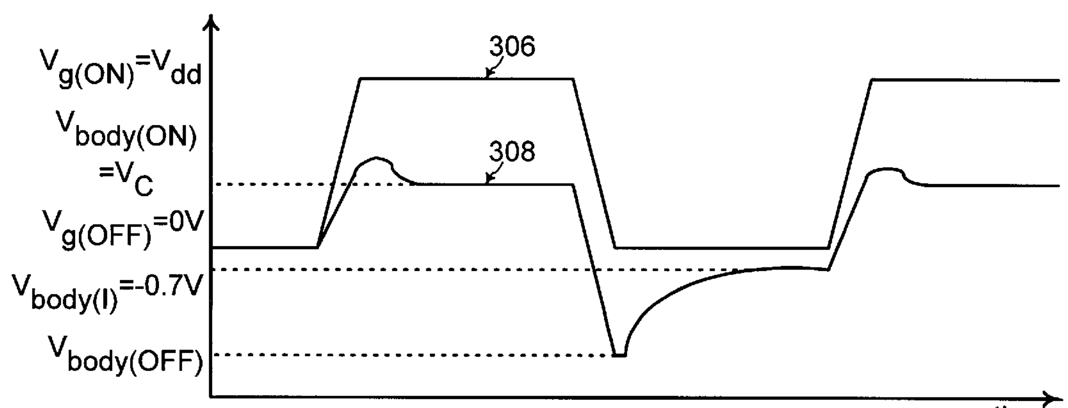
FIG. 6 shows a timing diagram of the voltage applied on the gate and the voltage formed on the body node of the MOSFET of FIGS. 4 and 5, according to the second embodiment of the present invention.

Referring to FIG. 4, a second embodiment of the present invention includes a dissipation diode 119 (instead of the grounding resistor 117 in FIG. 1) coupled between the floating body region 102 and ground. FIG. 5 shows a diagram of the circuit formed by the cross section of FIG. 4 including the dissipation diode 119. The PN polarity of the dissipation diode 119 is configured to be opposite of the second diode 120 that is formed by the p-type semiconductor material of the floating body region 102 and the n-type semiconductor material of the source region 106. Referring to FIG. 6, a first voltage waveform 306 shows the voltage $V_g$ at the gate 108 as the voltage of $V_{dd}$ is applied at the gate 108 to turn on the MOSFET 202 of FIG. 5. A second voltage waveform 308 shows the voltage $V_{body}$ formed at the floating body region 102 when the voltage of $V_{dd}$ is applied at the gate 108 of the MOSFET 202 of FIG. 5.

Referring to FIGS. 5 and 6, similar to the first embodiment of the present invention of FIGS. 1 and 2, the capacitance $C_C$ of the coupling capacitor 116 in the second embodiment of the present invention is designed such that $V_{body(ON)}=[V_{body(I)}+(C_C*V_{dd})/(C_C+C_P)]>V_C$ in order to ensure that the BJT 204 turns on and in order to achieve a lower magnitude of the threshold voltage $V_t$ of the MOSFET 202, when the MOSFET 202 is turned on. In addition, the capacitance $C_C$ of the coupling capacitor 116 in the second embodiment of the present invention is designed such that $V_{body(OFF)}=[V_C-(C_C*V_{dd})/(C_C+C_P)]$ is a negative voltage in order to achieve a higher magnitude of the threshold voltage $V_t$ of the MOSFET 202 when the MOSFET 202 is turned off.

Referring to FIGS. 5 and 6, with the dissipation diode 119 in the second embodiment of the present invention, after the voltage $V_g$ 302 at the gate 108 is switched to 0V and after $V_{body(OFF)}=[V_C-(C_C*V_{dd})/(C_C+C_P)]$, the dissipation diode 119 charges up the floating body region 102 back to −0.7V. Initially when $V_{body(OFF)}=[V_C-(C_C*V_{dd})/(C_C+C_P)]$, the dissipation diode 119 turns on to charge up the floating body region 102. When the voltage at the floating body region reaches −0.7V (i.e., the clamping voltage of the dissipation diode 119), the dissipation diode 119 turns off, and a voltage of −0.7V is maintained at the floating body region 102.

Referring to FIG. 6, when the voltage $V_g$ 302 at the gate 108 is again switched from 0V to $V_{dd}$ at the next cycle of $V_g$ 302, $V_{body(I)}=-0.7V$. The capacitance $C_C$ of the coupling capacitor 116 is designed such that $V_{body\ (ON)}=[V_{body(I)}+(C_C*V_{dd})/(C_C+C_P)]>V_C$ to ensure that the BJT 204 also turns on when the MOSFET 202 is turned on with a voltage change of $V_{dd}$ applied on the gate 108 with respect to the source region 106 of the MOSFET 202. In the second embodiment of the present invention of FIG. 4, $V_{body(I)}=-0.7V$ from the dissipation diode 119 being coupled between the floating body region 102 and ground. Note that in contrast to the grounding resistor 117 in the first embodiment of the present invention of FIGS. 1 and 2, simply the clamping voltage of the dissipation diode 119 in the second embodiment of the present invention of FIG. 4 determines the value of $V_{body(I)}$.

Figure 7:
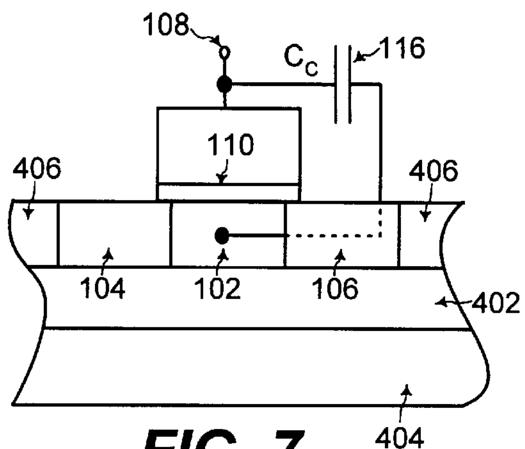
FIG. 7 shows a cross-sectional view of the MOSFET type device formed on SOI (Silicon On Insulator), according to another embodiment of the present invention.

Because the voltage on the floating body region 102 is controlled to change between $V_{body(ON)}$ and $V_{body(OFF)}$ as the MOSFET type device 100 is turned on and turned off, the floating body region 102 is electrically isolated. Referring to FIG. 7, the floating body region 102 is readily isolated in SOI (Silicon On Insulator) technology. In SOI technology, an insulator layer 402 is deposited on a semiconductor substrate 404. The drain region 104, the source region 106, and the floating body region 102 are formed on the insulator layer 402 to form a MOSFET. In SOI technology, the floating body region 102 is readily isolated from the semiconductor substrate 404 by the insulator layer 402. An isolation structure 406 isolates the MOSFET formed by the drain region 104, the source region 106, and the floating body region 102 on the insulator layer 402 in SOI technology.

Figure 8:
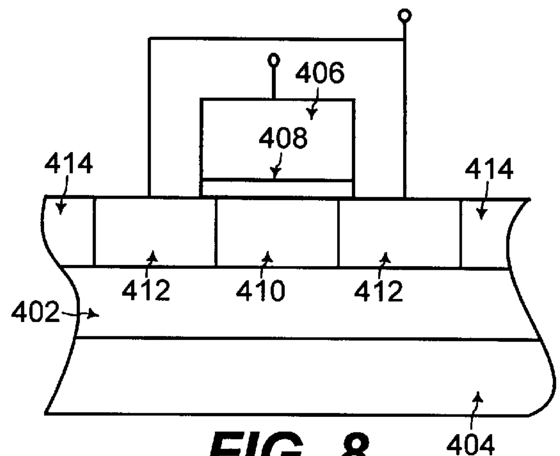
FIG. 8 shows a cross-sectional view of the coupling capacitor of FIGS. 1 and 4 formed on SOI (Silicon On Insulator), according to another embodiment of the present invention.

In addition, in SOI technology, the coupling capacitor 116 is readily formed as illustrated in FIG. 8. One node of the coupling capacitor 116 is formed by a polysilicon layer 406 deposited on a capacitor oxide 408. The capacitor oxide 408 is deposited on a first semiconductor region 410. The other node of the coupling capacitor 116 is formed by a second semiconductor region 412. An isolation structure 414 isolates the coupling capacitor 116 formed on the insulating layer 402 in SOI technology.

Figure 9:
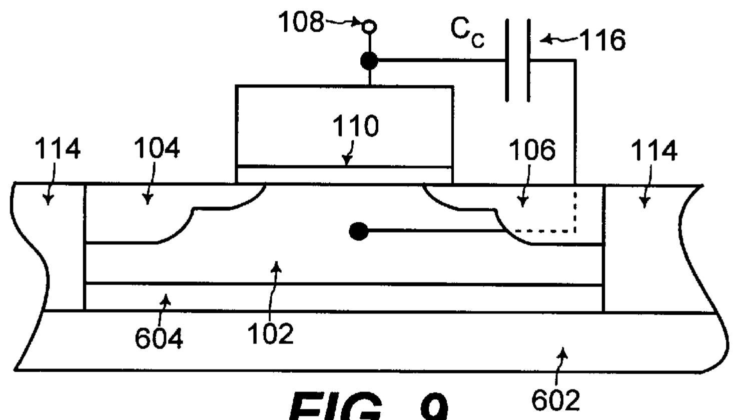
FIG. 9 shows a cross-sectional view of the MOSFET type device formed within a well of a semiconductor substrate, according to another embodiment of the present invention.

Alternatively, referring to FIG. 9, the MOSFET type device 100 of the present invention may be fabricated within a well of a semiconductor substrate 602. For the example of an p-type doped body region 102, a reversed biased PN junction electrically isolates the floating body region 102 from the semiconductor substrate 602. In that case, the semiconductor substrate 602 is p-type doped, and an n-type doped layer 604 is formed between the body region 102 and the semiconductor substrate 602.

The foregoing is by way of example only and is not intended to be limiting. For example, the present invention has been described for a MOSFET type device having an N-channel MOSFET. However, the present invention may also be used for a MOSFET type device having a P-channel MOSFET, as would be apparent to one of ordinary skill in the art from the description herein. In that case, referring to FIGS. 1 and 2, the floating body region 102 is comprised of an n-type semiconductor material, and the drain region 104 and the source region 106 are comprised of p-type semiconductor material. Also in that case, the BJT 204 coupled in parallel with such a P-channel MOSFET is then a PNP BJT.

Figure 10:
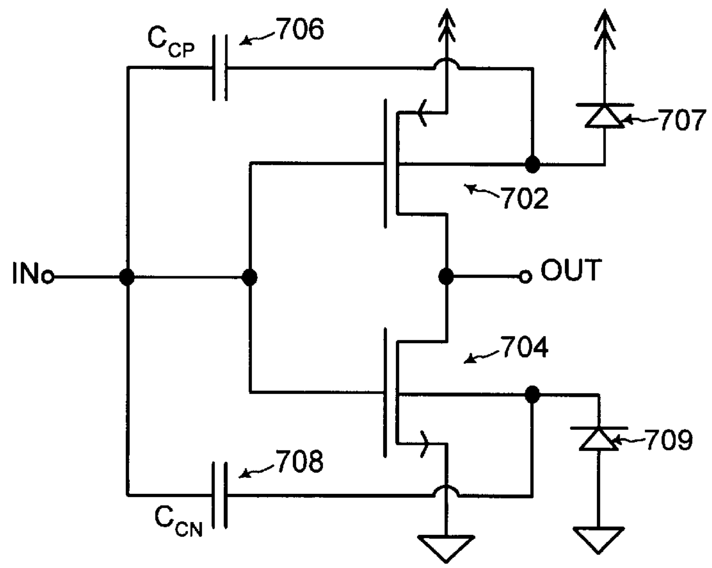
FIG. 10 illustrates using a coupling capacitor for both a P-channel MOSFET and an N-channel MOSFET for higher drive current and lower steady state power dissipation in both the P-channel MOSFET and the N-channel MOSFET, according to the present invention.

Referring to FIG. 10, a P-channel MOSFET 702 and an N-channel MOSFET 704 are coupled as a conventional CMOS inverter. In addition, a first coupling capacitor 706 is coupled between the floating body region and the gate of the P-channel MOSFET 702, and a first dissipation diode 707 is coupled between a positive power supply and the floating body region of the P-channel MOSFET 702. The body region of the P-channel MOSFET 702 is electrically isolated to form a floating body region. A capacitance $C_{CP}$ of the first coupling capacitor 706 is designed for a lower magnitude of the threshold voltage when the P-channel MOSFET 702 is turned on and for a higher magnitude of the threshold voltage when the P-channel MOSFET 702 is turned off, in accordance with the description of the present invention herein.

A second coupling capacitor 708 is coupled between the floating body region and the gate of an N-channel MOSFET 704, and a second dissipation diode 709 is coupled between ground and the floating body region of the N-channel MOSFET 704. The body region of the N-channel MOSFET 704 is electrically isolated to form a floating body region. A capacitance $C_{CN}$ of the second coupling capacitor 708 is designed for a lower magnitude of the threshold voltage when the N-channel MOSFET 704 is turned on and for a higher magnitude of the threshold voltage when the N-channel MOSFET 704 is turned off, in accordance with the description of the present invention herein.

The invention is limited only as defined in the following claims and equivalents thereof.

We claim:

1. A MOSFET (Metal Oxide Semiconductor Field Effect Transistor) type device having higher drive current when turned on and having lower steady state power dissipation when turned off, said MOSFET type device being fabricated on a semiconductor substrate, and said MOSFET type device comprising:

- a floating body region that is electrically isolated from said semiconductor substrate;
- a drain region abutting said floating body region;
- a source region abutting said floating body region;
- a gate formed on a gate insulator disposed on top of said floating body region between said drain region and said source region;
- a coupling capacitor that is operatively coupled between said gate and said floating body region, wherein said coupling capacitor has a capacitance of $C_C$;
- and wherein said floating body region, said drain region, said source region, and said gate form a MOSFET (Metal Oxide Semiconductor Field Effect Transistor);

and wherein said drain region forms a collector of a BJT (Bipolar Junction Transistor), said floating body region forms a base of said BJT, and said source region forms an emitter of said BJT;

and wherein said MOSFET is turned on when a voltage change of $V_{dd}$ is applied on said gate with respect to said source region; and means for biasing said floating body region to an initial voltage of $V_{body(I)}$ before the voltage change of $V_{dd}$ is applied on the gate with respect to the source of the MOSFET when the MOSFET is switched to turn on from being turned off;

and wherein said capacitance, $C_C$, of said coupling capacitor is designed such that $(V_{body(I)}+(C_C*V_{dd})/(C_C+C_P)>V_C$ to provide a positive voltage at said floating body region with respect to said source region when said MOSFET is turned on, wherein $C_P$ is a capacitance of an effective parasitic capacitor at said floating body region, and wherein $V_C$ is a clamping voltage of a diode formed by said base and said emitter of said BJT.

2. The MOSFET type device of claim 1, wherein said design of said capacitance $C_C$ of said coupling capacitor, such that $(V_{body(I)}+(C_C*V_{dd})/(C_C+C_P)>V_C$, results in said BJT turning on when said MOSFET is turned on.

3. The MOSFET type device of claim 1, wherein said positive voltage at said floating body region with respect to said source region, when said MOSFET is turned on, results in a lower magnitude of a threshold voltage of said MOSFET.

4. The MOSFET type device of claim 1, wherein said capacitance, $C_C$, of said coupling capacitor is designed such that $(V_C-(C_C*V_{dd})/(C_C+C_P)$ is a negative value to provide a negative voltage at said floating body region with respect to said source region when said MOSFET is turned off.

5. The MOSFET type device of claim 4, wherein said design of said capacitance $C_C$ of said coupling capacitor being designed, such that $(V_C-(C_C*V_{dd})/(C_C+C_P)$ is a negative value, results in said BJT turning off when said MOSFET is turned off.

6. The MOSFET type device of claim 4, wherein said negative voltage at said floating body region with respect to said source region, when said MOSFET is turned off, results in a higher magnitude of a threshold voltage of said MOSFET.

7. The MOSFET type device of claim 1, wherein said floating body region is comprised of a p-type semiconductor material, said drain region is comprised of an n-type semiconductor material, and said source region is comprised of an n-type semiconductor material, such that said MOSFET is an N-channel MOSFET and such that said BJT is an NPN BJT.

8. The MOSFET type device of claim 1, wherein said floating body region is comprised of an n-type semiconductor material, said drain region is comprised of a p-type semiconductor material, and said source region is comprised of a p-type semiconductor material, such that said MOSFET is a P-channel MOSFET and such that said BJT is a PNP BJT.

9. The MOSFET type device of claim 1, wherein said floating body region, said drain region, and said source region are formed on SOI (Silicon-On-Insulator).

10. The MOSFET type device of claim 1, further comprising:

means for biasing said floating body region with a negative voltage with respect to said source region when said MOSFET is turned off such that said BJT is turned off when said MOSFET is turned off, and such that said negative voltage at said floating body region with respect to said source region, when said MOSFET is turned off, results in a higher magnitude of a threshold voltage of said MOSFET.

11. A MOSFET (Metal Oxide Semiconductor Field Effect Transistor) type device having higher drive current when turned on and having lower steady state power dissipation when turned off, said MOSFET type device being fabricated on a semiconductor substrate, and said MOSFET type device comprising:

a floating body region that is electrically isolated from said semiconductor substrate;

a drain region abutting said floating body region;

a source region abutting said floating body region;

a gate formed on a gate insulator disposed on top of said floating body region between said drain region and said source region;

a coupling capacitor that is operatively coupled between said gate and said floating body region, wherein said coupling capacitor has a capacitance of $C_C$;

and wherein said floating body region, said drain region, said source region, and said gate form a MOSFET (Metal Oxide Semiconductor Field Effect Transistor);

and wherein said drain region forms a collector of a BJT (Bipolar Junction Transistor), said floating body region forms a base of said BJT, and said source region forms an emitter of said BJT;

and wherein said MOSFET is turned on when a voltage change of $V_{dd}$ is applied on said gate with respect to said source region; and means for biasing said floating body region to an initial voltage of $V_{body(I)}$ before the voltage change of $V_{dd}$ is applied on the gate with respect to the source of the MOSFET when the MOSFET is switched to turn on from being turned off;

and wherein said capacitance, $C_C$, of said coupling capacitor is designed such that $(V_{body(I)}+(C_C*V_{dd})/(C_C+C_P)>V_C$ to provide a positive voltage at said floating body region with respect to said source region when said MOSFET is turned on, and wherein $C_P$ is a capacitance of an effective parasitic capacitor at said floating body region, and wherein $V_C$ is a clamping voltage of a diode formed by said base and said emitter of said BJT;

and wherein said design of said capacitance $C_C$ of said coupling capacitor, such that $(V_{body(I)}+(C_C*V_{dd})/(C_C+C_P)>V_C$, results in said BJT turning on when said MOSFET is turned on;

and wherein said positive voltage at said floating body region with respect to said source region, when said MOSFET is turned on, results in a lower magnitude of a threshold voltage of said MOSFET;

and wherein said capacitance $C_C$ of said coupling capacitor is designed such that $(V_C-(C_C*V_{dd})/(C_C+C_P)$ is a negative value to provide a negative voltage at said floating body region with respect to said source region when said MOSFET is turned off;

and wherein said design of said capacitance $C_C$ of said coupling capacitor, such that $(V_C-(C_C*V_{dd})/(C_C+C_P)$ is a negative value, results in said BJT turning off when said MOSFET is turned off;

and wherein said negative voltage at said floating body region with respect to said source region, when said MOSFET is turned off, results in a higher magnitude of said threshold voltage of said MOSFET;

and wherein said floating body region is comprised of a p-type semiconductor material, said drain region is comprised of an n-type semiconductor material, and said source region is comprised of an n-type semiconductor material, such that said MOSFET is an N-channel MOSFET and such that said BJT is an NPN BJT;

and wherein said floating body region, said drain region, and said source region are formed on SOI (Silicon-On-Insulator).

12. A MOSFET (Metal Oxide Semiconductor Field Effect Transistor) type device having higher drive current when turned on and having lower steady state power dissipation when turned off, said MOSFET type device being fabricated on a semiconductor substrate, and said MOSFET type device comprising:

a floating body region that is electrically isolated from said semiconductor substrate;

a drain region abutting said floating body region;

a source region abutting said floating body region;

a gate formed on a gate insulator disposed on top of said floating body region between said drain region and said source region;

a coupling capacitor that is operatively coupled between said gate and said floating body region, wherein said coupling capacitor has a capacitance of $C_C$;

and wherein said floating body region, said drain region, said source region, and said gate form a MOSFET (Metal Oxide Semiconductor Field Effect Transistor);

and wherein said drain region forms a collector of a BJT (Bipolar Junction Transistor), said floating body region forms a base of said BJT, and said source region forms an emitter of said BJT;

and wherein said MOSFET is turned on when a voltage change of $V_{dd}$ is applied on said gate with respect to said source region; and means for biasing said floating body region with a positive voltage with respect to said source region when said MOSFET is turned on such that said BJT is turned on when said MOSFET is turned on, and such that said positive voltage at said floating body region with respect to said source region, when said MOSFET is turned on, results in a lower magnitude of a threshold voltage of said MOSFET.

13. A method for increasing the drive current and decreasing the steady state power dissipation of a MOSFET (Metal Oxide Semiconductor Field Effect Transistor) type device that is fabricated on a semiconductor substrate, said MOSFET type device being comprised of a drain region and a source region that each abut a body region and being comprised of a gate having a gate insulator disposed on top of said body region between said drain region and said source region, and wherein said body region, said drain region, said source region, and said gate form a MOSFET (Metal Oxide Semiconductor Field Effect Transistor), the method including the steps of:

electrically isolating said body region from said semiconductor substrate to form a floating body region;

and wherein said drain region forms a collector of a BJT (Bipolar Junction Transistor), and wherein said floating body region forms a base of said BJT, and wherein said source region forms an emitter of said BJT;

and wherein said MOSFET is turned on when a voltage change of $V_{dd}$ is applied on said gate with respect to said source region;

biasing said floating body region to an initial voltage of $V_{body(I)}$ before the voltage change of $V_{dd}$ is applied on the gate with respect to the source of the MOSFET when the MOSFET is switched to turn on from being turned off;

designing a capacitance of $C_C$ of a coupling capacitor, that is operatively coupled between said gate and said floating body region, such that $(V_{body(I)}+(C_C*V_{dd})/(C_C+C_P)>V_C$ to provide a positive voltage at said floating body region with respect to said source region when said MOSFET is turned on, and wherein $C_P$ is a capacitance of an effective parasitic capacitor at said floating body region, and wherein $V_C$ is a clamping voltage of a diode formed by said base and said emitter of said BJT;

turning on said BJT when said MOSFET is turned on with said voltage change of $V_{dd}$ being applied on said gate with respect to said source region; and reducing a threshold voltage of said MOSFET with said positive voltage at said floating body region with respect to said source region when said MOSFET is turned on.

14. The method of claim 13, further including the step of:

designing said coupling capacitor such that $(V_C-(C_C*V_{dd})/(C_C+C_P)$ is a negative value to provide a negative voltage at said floating body region with respect to said source region when said MOSFET is turned off;

turning off said BJT when said MOSFET is turned off; and raising said threshold voltage of said MOSFET with said negative voltage at said floating body region with respect to said source region when said MOSFET is turned off.

15. The method of claim 13, wherein said floating body region is comprised of a p-type semiconductor material, said drain region is comprised of an n-type semiconductor material, and said source region is comprised of an n-type semiconductor material, such that said MOSFET is an N-channel MOSFET and such that said BJT is an NPN BJT.

16. The method of claim 13, wherein said floating body region is comprised of an n-type semiconductor material, said drain region is comprised of a p-type semiconductor material, and said source region is comprised of a p-type semiconductor material, such that said MOSFET is a P-channel MOSFET and such that said BJT is a PNP BJT.

17. The method of claim 13, wherein said floating body region, said drain region, and said source region are formed on SOI (Silicon-On-Insulator).

* * * * *